US009614063B2

(12) United States Patent
Friedman et al.

(10) Patent No.: US 9,614,063 B2
(45) Date of Patent: Apr. 4, 2017

(54) HOMOEPITAXIAL TUNNEL BARRIERS WITH FUNCTIONALIZED GRAPHENE-ON-GRAPHENE AND METHODS OF MAKING

(71) Applicants: Adam L. Friedman, Silver Spring, MD (US); Olaf M. T. van 't Erve, Falls Church, VA (US); Connie H. Li, Alexandria, VA (US); Jeremy T. Robinson, Washington, DC (US); Berend T. Jonker, Waldorf, MD (US)

(72) Inventors: Adam L. Friedman, Silver Spring, MD (US); Olaf M. T. van 't Erve, Falls Church, VA (US); Connie H. Li, Alexandria, VA (US); Jeremy T. Robinson, Washington, DC (US); Berend T. Jonker, Waldorf, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 143 days.

(21) Appl. No.: 14/629,939

(22) Filed: Feb. 24, 2015

(65) Prior Publication Data
US 2015/0303059 A1   Oct. 22, 2015

Related U.S. Application Data

(60) Provisional application No. 61/980,448, filed on Apr. 16, 2014.

(51) Int. Cl.
*H01L 29/66* (2006.01)
*H01L 21/308* (2006.01)
(Continued)

(52) U.S. Cl.
CPC .. *H01L 29/66984* (2013.01); *H01L 21/02115* (2013.01); *H01L 21/02227* (2013.01);
(Continued)

(58) Field of Classification Search
CPC ......... H01L 21/02115; H01L 21/02227; H01L 21/3081
See application file for complete search history.

(56) References Cited

U.S. PATENT DOCUMENTS

| 2012/0069338 A1* | 3/2012 | Afzali | ............... G01N 21/553 356/432 |
| 2012/0202056 A1* | 8/2012 | Wolf | .................... B82Y 30/00 428/336 |

(Continued)

OTHER PUBLICATIONS

Ionescu, Adrian M., and Heike Riel. "Tunnel field-effect transistors as energy-efficient electronic switches." Nature 479.7373 (2011): 329-337.
(Continued)

*Primary Examiner* — Errol Fernandes
(74) *Attorney, Agent, or Firm* — US Naval Research Laboratory; Stephen T. Hunnius

(57) ABSTRACT

This disclosure describes a method of making a tunnel barrier-based electronic device, in which the tunnel barrier and transport channel are made of the same material—graphene. A homoepitaxial tunnel barrier/transport device is created using a monolayer chemically modified graphene sheet as a tunnel barrier on another monolayer graphene sheet. This device displays enhanced spintronic properties over heteroepitaxial devices and is the first to use graphene as both the tunnel barrier and channel.

16 Claims, 4 Drawing Sheets

(51) Int. Cl.
  *H01L 29/16*    (2006.01)
  *H01L 29/45*    (2006.01)
  *H01L 29/423*   (2006.01)
  *H01L 21/02*    (2006.01)

(52) U.S. Cl.
  CPC ...... *H01L 21/3081* (2013.01); *H01L 29/1606* (2013.01); *H01L 29/4236* (2013.01); *H01L 29/45* (2013.01)

(56) References Cited

U.S. PATENT DOCUMENTS

| | | | | |
|---|---|---|---|---|
| 2014/0270271 | A1* | 9/2014 | Dehe | B81B 3/0018 381/174 |
| 2015/0221408 | A1* | 8/2015 | Gong | H01B 1/04 428/457 |
| 2015/0381078 | A1* | 12/2015 | Massoner | B81C 1/00 658 310/300 |

OTHER PUBLICATIONS

Cobas, Enrique, et al. "Graphene as a tunnel barrier: graphene-based magnetic tunnel junctions." Nano letters 12.6 (2012): 3000-3004.

Van't Erve, O. M. J., et al. "Low-resistance spin injection into silicon using graphene tunnel barriers." Nature nanotechnology 7.11 (2012): 737-742.

Yamaguchi, Takehiro, et al. "Electrical spin injection into graphene through monolayer hexagonal boron nitride." Applied Physics Express 6.7 (2013): 073001.

Dlubak, Bruno, et al. "Highly efficient spin transport in epitaxial graphene on SiC." Nature Physics 8.7 (2012): 557-561.

Volmer, F., et al. "Role of MgO barriers for spin and charge transport in Co/MgO/graphene nonlocal spin-valve devices." Physical Review B 88.16 (2013): 161405.

* cited by examiner

HOMOEPITAXIAL TUNNEL BARRIERS WITH FUNCTIONALIZED GRAPHENE-ON-GRAPHENE AND METHODS OF MAKING

This application claims priority to and the benefits of U.S. Patent Application No. 61/980,448 filed on Apr. 16, 2014, the entirety of which is herein incorporated by reference.

BACKGROUND

The quantum phenomenon of tunneling enables novel charge-based devices with ultra-low power consumption, and is key to the emerging field of spintronics.

Tunnel devices typically require mating dissimilar materials and maintaining monolayer level control of thickness, raising issues that severely complicate fabrication and compromise performance. The recent discoveries of intrinsically 2-dimensional materials such as graphene and h-BN have created new perspectives on tunnel barriers. Their strong in-plane bonding promotes self-healing of pinholes and a well-defined layer thickness, important because the tunnel current depends exponentially upon the barrier thickness.

There has been keen interest in utilizing graphene, a two-dimensional (2D) honeycomb lattice of carbon atoms, as a high mobility transport channel. Its linear band dispersion, ambipolar conduction, and remarkable in-plane electronic transport properties have stimulated development of RF transistors and wafer-scale fabrication of graphene circuits. Graphene also exhibits exceptional in-plane spin transport characteristics, including long spin diffusion lengths due to its low spin-orbit interaction, which has stimulated ideas for novel spin devices.

The highest values for spin diffusion lengths and spin lifetimes have been measured using mechanically exfoliated graphene, which, although it possesses extraordinary electrical properties, is not amenable for device scalability, as devices must be fabricated on individual, randomly placed and sized flakes. Moreover, spin injection into graphene from a ferromagnetic metal contact typically requires the use of an oxide tunnel barrier such as $Al_2O_3$ or MgO to accommodate the large conductivity mismatch. These materials do not wet the graphene surface, making it very difficult to control the thickness and uniformity of the tunnel barrier.

In addition, the mobility of graphene is significantly degraded by coupling to phonons or charged impurities/defects in an adjacent oxide. Consequently, significant effort has focused on exploiting other carbon thin films and 2D materials such as h-BN or $MoS_2$ as a substrate, gate dielectric, or tunnel barrier for graphene devices. This improves operating characteristics, but significantly complicates the fabrication, and often relies upon sequential mechanical exfoliation to produce a few device structures.

Although single layer graphene itself has been shown to function as a tunnel barrier in a heterostructure, it does not effectively serve as a tunnel barrier on another layer of graphene because there is electrical interaction between the two layers, regardless of the stacking orientation, except in a large magnetic field.

One can markedly alter graphene's physical properties with chemical functionalization by fluorination or hydrogenation. Fluorinated graphene is an excellent in-plane insulator, and no electrical communication is observed between adjacent layers of fluorographene and graphene, allowing for its use as a tunnel barrier in an all-graphene tunnel-transport homoepitaxial structure.

Only two other methods have been devised for making tunnel barriers on graphene. First, a method of high-energy electron-beam lithographic decomposition of vaporized carbon can produce amorphous carbon layers on the surface of the graphene channel and can act as a tunnel barrier. Although this method produces tunnel barriers, the high-energy electron beam adds charged impurities to the substrate, affecting the transport properties of the graphene channel, and it can induce physical damage to the graphene channel by driving off individual carbon atoms from the lattice. A second alternative method involves the chemical vapor deposition growth of thin layer hexagonal-BN, which is then transferred to the graphene transfer. However, this process does not produce exceptional results and is not homoepitaxial, requiring the growth and transfer of two completely different materials with vastly different growth mechanisms and properties. Thus, it is also unsuitable for industrial scaling.

BRIEF SUMMARY OF THE INVENTION

This disclosure describes a process to fabricate a completely new kind of tunnel barrier-based electronic device, in which the tunnel barrier and transport channel are made of the same material—graphene. A never-before-seen homoepitaxial tunnel barrier/transport structure is created using a monolayer chemically modified graphene sheet as a tunnel barrier on another monolayer graphene sheet. The new type of device displays enhanced spintronic properties over heteroepitaxial devices and is the first to use graphene as both the tunnel barrier and channel.

BRIEF DESCRIPTION OF THE DRAWINGS

FIG. 1A illustrates an optical image of a device with fluorination only under the Py contacts. The scale bar is 20 µm. FIG. 1B illustrates an optical image of a device fluorinated everywhere. The contrast of the upper layer of graphene changes, becoming transparent, as it is fluorinated. The scale bar is 20 µm. FIG. 1C illustrates an IV curve of a 2T graphene device before fluorination.

FIG. 2A illustrates Dirac curves taken using the $SiO_2$/Si substrate as a back gate. One line illustrates between contacts 2 and 3 (only on the fluorographene). Another line illustrates between contacts 1 and 4 (only on the graphene channel). The fluorographene shows no Dirac point, indicating that it is fully insulating and electrically uncoupled from the graphene that is underneath it. FIG. 2B illustrates current-voltage curves for a typical device. Taken between contacts 1 and 2 or 1 and 3 (includes the tunnel barrier), the curves are non-Ohmic. Taken between contacts 1 and 4 (graphene channel only) the curve is linear. The inset further highlights this by showing dV/dI vs. V when the tunnel barrier is included in the circuit. FIG. 2C illustrates zero bias resistance vs. temperature for the Py contacts showing a weak temperature dependence (non-metallic behavior) that is a hallmark of a good tunnel barrier.

FIG. 3A illustrates non-local spin valve (NLSV) measurement taken at 10 K. The arrows below the curve indicate the direction of the field sweep. The arrows above the curve indicate the ferromagnetic contact magnetization directions.

A small constant background of ~400 Ohms was subtracted from the data. FIG. 3B illustrates 4T Hanle (top and right axes) vs. 2T Hanle and witness sample (bottom and left axes). All data taken at 10 K. The dotted lines show fits to the appropriate models. Here, $\tau_s$ for 2T/4T was 96 ps/205 ps. FIG. 3C illustrates bias dependence of 2T (triangle) and 4T (square) Hanle signal amplitude. FIG. 3D illustrates bias dependence of the NLSV plateau $\Delta R_{NL}$ and the spin polarization efficiency, showing evidence of spin-filtered tunneling.

DETAILED DESCRIPTION

Figure 1A:
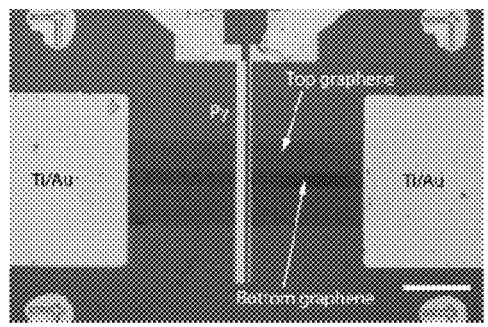
FIGS. 1A, 1B, and 1C illustrate images and electrical characterization before and after device fluorination.

This disclosure describes a process to fabricate a completely new kind of tunnel barrier-based electronic device, in which the tunnel barrier and transport channel are made of the same material, graphene. A never-before-seen homoepitaxial tunnel barrier/transport structure is created using a monolayer chemically modified graphene sheet as a tunnel barrier on another monolayer graphene sheet. The new type of device displays enhanced spintronic properties over heteroepitaxial devices and is the first to use graphene as both the tunnel barrier and channel.

The quantum phenomenon of tunneling enables novel charge-based devices with ultra-low power consumption, and is key to the emerging field of spintronics. Tunnel devices typically require mating dissimilar materials and maintaining monolayer level control of thickness, raising issues that severely complicate fabrication and compromise performance. The recent discoveries of intrinsically 2-dimensional materials such as graphene and h-BN have created new perspectives on tunnel barriers. Their strong in-plane bonding promotes self-healing of pinholes and a well-defined layer thickness, important because the tunnel current depends exponentially upon the barrier thickness.

There has been keen interest in utilizing graphene, a two-dimensional (2D) honeycomb lattice of carbon atoms, as a high mobility transport channel. Its linear band dispersion, ambipolar conduction, and remarkable in-plane electronic transport properties have stimulated development of RF transistors and wafer-scale fabrication of graphene circuits. Graphene also exhibits exceptional in-plane spin transport characteristics, including long spin diffusion lengths due to its low spin-orbit interaction, which has stimulated ideas for novel spin devices. The highest values for spin diffusion lengths and spin lifetimes have been measured using mechanically exfoliated graphene, which, although it possesses extraordinary electrical properties, is not amenable for device scalability, as devices must be fabricated on individual, randomly placed and sized flakes. Moreover, spin injection into graphene from a ferromagnetic metal contact typically requires the use of an oxide tunnel barrier such as $Al_2O_3$ or MgO to accommodate the large conductivity mismatch. These materials do not wet the graphene surface, making it very difficult to control the thickness and uniformity of the tunnel barrier. In addition, the mobility of graphene is significantly degraded by coupling to phonons or charged impurities/defects in an adjacent oxide. Consequently, significant effort has focused on exploiting other carbon thin films and 2D materials such as h-BN or $MoS_2$ as a substrate, gate dielectric, or tunnel barrier for graphene devices. This improves operating characteristics, but significantly complicates the fabrication, and often relies upon sequential mechanical exfoliation to produce a few device structures.

Although single layer graphene itself has been shown to function as a tunnel barrier in a heterostructure, it does not effectively serve as a tunnel barrier on another layer of graphene because there is electrical interaction between the two layers, regardless of the stacking orientation, except in a large magnetic field. One can markedly alter graphene's physical properties with chemical functionalization by fluorination or hydrogenation. Fluorinated graphene is an excellent in-plane insulator, and no electrical communication is observed between adjacent layers of fluorographene and graphene, suggesting its use as a tunnel barrier in an all-graphene tunnel-transport homoepitaxial structure.

Here, described is a method of fabrication and demonstration of the operation of the world's first homoepitaxial graphene-on-graphene tunnel barrier/transport structure.

Demonstrated is the increased performance of our new structure by fabricating spintronic devices where a monolayer of chemically functionalized graphene acts as a tunnel barrier on a monolayer of non-functionalized graphene, and demonstrate electrical spin injection, lateral transport, and detection by 4-terminal non-local spin valve and Hanle effect measurements. We find the highest spin efficiency values yet measured for graphene, and present evidence for the theoretically predicted enhancement of tunnel spin polarization.

Example 1

Formation of the Homoepitaxial Graphene Tunnel Barrier/Transport Channel Device Graphene was grown by chemical vapor deposition (CVD) via decomposition of methane in small Cu foil enclosures. This method produces monolayer graphene films with grain sizes on the order of hundreds of microns containing minimal defects. After growth, the graphene is removed from the Cu growth substrate by etching the copper in acid solution, and then it is mechanically transferred onto a $SiO_2$/Si substrate.

Care is taken to eliminate the exposure of graphene to standard optical photoresists, which can leave significant residues on graphene. Instead, a PMMA-based process is used, which produces fewer residues. The first layer of graphene is spin-coated with a thin layer of PMMA followed by Shipley S1818 photoresist. Using photolithography, a mesa pattern is defined in the photoresist and $O_2$ plasma is used to etch through the PMMA and unwanted graphene. The sample is rinsed in acetone and isopropyl alcohol (IPA) to remove the etch mask. Ohmic reference contacts and bond pads are then defined using a MMA/PMMA mask with features defined using high-current (~7 nA) electron-beam lithography writing. Ti/Au is deposited using electron beam deposition and lift-off in acetone.

A second layer of graphene that will act as the tunnel barrier is then deposited on top of these devices using the same methods as above. A second mesa etch, similar to the first, is performed. Electron-beam lithography using a MMA/PMMA resist is then used to define trenches for deposition of ferromagnetic contacts by electron beam deposition and lift-off. The graphene in these trenches is fluorinated by placing the sample in $XeF_2$ gas until the resistance of a concurrently fluorinated 2-terminal graphene device reaches approximately 50 GΩ, indicating that the upper graphene layer is fully insulating. This is shown in FIG. 1. NiFe/Au is then deposited by electron beam evaporation and lift-off is performed in acetone.

Just prior to placing the devices in a cryostat for measurement, a final fluorination is performed to fluorinate the remaining upper layer of graphene to prevent any edge state conduction. Again, IV characteristics of a concurrently fluorinated 2-terminal graphene devices are measured and the observation of high resistance ensures that the fluorination process has succeeded. After this fluorination, the upper layer of graphene (now fluorographene) changes optical contrast, becoming visibly almost transparent. This contrast change is further evidence that the fluorination was successful.

Example 2

Demonstration of Tunneling Behavior

Figure 1B:
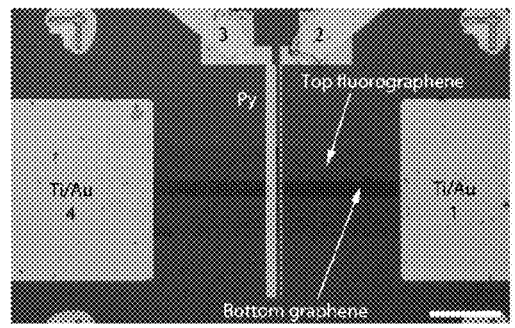
Figure 1C:
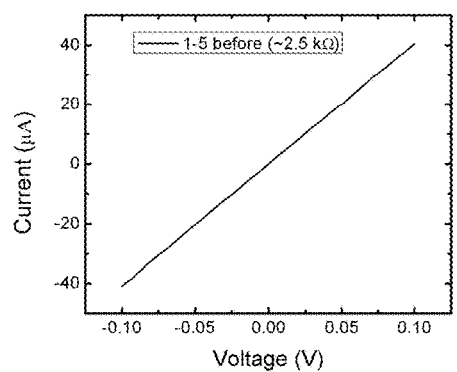
Figure 1D:
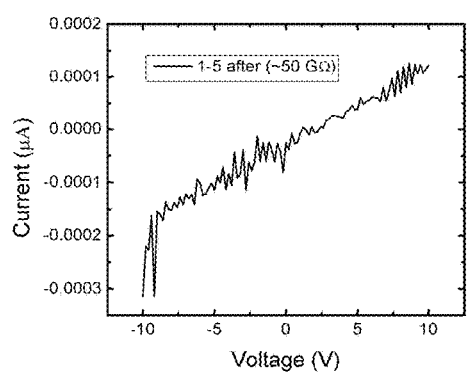
FIG. 1D illustrates an IV curve of the same device after fluorination, showing that the graphene is now an insulator.
Figure 2A:
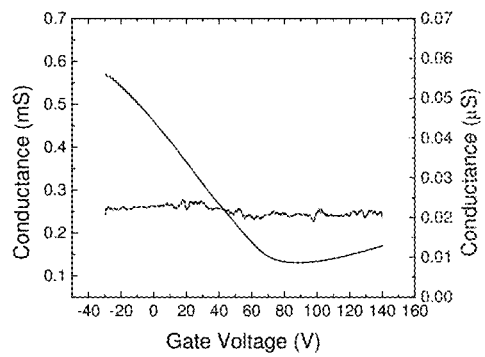
FIGS. 2A, 2B, and 2C are demonstrations of tunneling behavior.

FIG. 1B shows an image of the device structure. It consists of two ferromagnetic permalloy/fluorinated graphene tunnel contacts (contacts 2 and 3) placed between two Au/Ti contacts (1 and 4). The Au/Ti contacts show Ohmic behavior, as expected. The Conductance vs. Back Gate Voltage, measured between the two Ohmic Au/Ti contacts (FIG. 2A), shows the Dirac point of the bottom graphene channel at ~80V, indicating a high electron concentration. The transistor characteristics measured between the two permalloy (Py, $Ni_{80}Fe_{20}$) contacts that only contact the top fluorinated graphene film (FIG. 2A), shows no modulation or Dirac point. This confirms that the graphene layers are indeed not communicating electrically, as expected after fluorination. The conductance of the device between these two Py contacts is orders of magnitude less than the conductance of the fluorinated graphene film, indicating that all of the electrical transport measured is due to tunneling through the fluorinated graphene and into the underlying graphene transport channel.

Figure 2B:
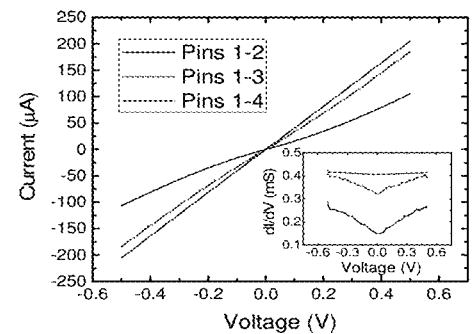
Figure 2C:
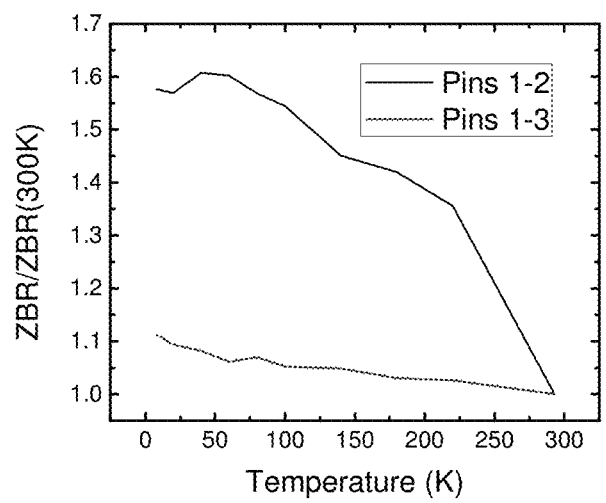

FIG. 2B shows IV curves taken between the Py and the Ohmic Au/Ti contacts. These curves exhibit markedly non-Ohmic behavior, further emphasized in the inset of FIG. 2B with a graph of the differential conductance vs. voltage, and provide additional support that the fluorinated graphene is acting as a tunnel barrier. The temperature dependence of the zero bias resistance (FIG. 2C) is weak and insulator-like in character, changing by a factor less than 1.7 for both Py contacts. Non-Ohmic IV curves and a weakly temperature dependent zero bias resistance has been shown to be firm confirmation of tunneling behavior in the contacts.

Example 3

Operation of the Device as a Spin Valve

In non-local spin valve (NLSV) measurements, a bias current is applied between one of the FM contacts and the nearest Ohmic reference contact, and a spin-polarized charge current is injected from the FM across the fluorinated graphene tunnel barrier and into the graphene transport channel. Spin simultaneously diffuses in all directions, creating a pure spin current on one side, and the corresponding spin accumulation results in a spin-splitting of the chemical potential. This is manifested as a voltage on the second FM contact, which is outside of the charge current path and referred to as the non-local detector. An in-plane magnetic field is used to control the relative orientation of the magnetizations of the FM injector and detector contacts. When the magnetizations are parallel, the voltage measured will be smaller than when they are antiparallel. Sweeping the magnetic field causes the contact magnetizations to reverse in-plane at their respective coercive fields and produce a measurable voltage peak.

In order to observe this effect, we fabricate the Py contacts with two different widths (0.5 μm and 3 μm) to exploit magnetic shape anisotropy so that the coercivities of the ferromagnetic contacts are different. This NLSV behavior is clearly observed in FIG. 3A, where distinct steps in the non-local resistance (the measured voltage divided by the bias current) appear at the coercive fields of the wide and narrow FM contacts, producing plateaus of higher resistance when the FM contact magnetizations are antiparallel. This demonstrates successful spin injection and detection at the FM/fluorinated graphene tunnel contacts, and lateral spin transport in the graphene channel.

The spin lifetime corresponding to this pure spin current is quantitatively determined using the Hanle effect, in which a magnetic field $B_z$ applied along the surface normal causes the spins in the graphene transport channel to precess at the Larmor frequency, $\omega_L = g\mu_B B_z/\hbar$, and dephase. Here g is the Lande g-factor (g~2 for graphene), $\mu_B$ is the Bohr magneton, and $\hbar$ is Planck's constant. As the magnetic field increases, the net spin polarization and corresponding spin voltage decreases to zero with a characteristic pseudo-Lorentzian line shape. FIG. 3B shows Hanle spin precession curves for both non-local and local contact geometries for a typical device used in this study in comparison to a witness sample device where the top graphene layer was not fluorinated. We note that no NLSV signal or Hanle effect is apparent in the witness sample, demonstrating that the fluorinated graphene tunnel barrier is necessary to achieve spin injection.

We measure Hanle spin precession in two different electrical configurations. The spin lifetime of the pure spin current is measured in the NLSV or 4T configuration, where the full-width-half-max of the measured change in voltage is directly proportional to the steady-state spin polarization at the detector, given by $$S(x_1, x_2, B_z) = S_0 \int_0^\infty \frac{1}{\sqrt{4\pi Dt}} e^{-(x_2-x_1-v_d t)^2/4Dt} \cos(\omega_L t) e^{-t/\tau_s} dt \quad (1)$$

where spin is injected into the graphene at $x_1$ and t=0 and detected at $x_2$. $S_0$ is the spin injection rate, D is the electron diffusion constant, $v_d$ is the electron drift velocity (=0 for diffusive transport), and $\tau_s$ is the spin lifetime. Secondly, the spin current can be injected and the spin voltage detected with same Py contact in a 2-terminal (2T) configuration. Here, we measure the spin accumulation and lifetime directly under the Py contact, and the voltage $\Delta V_{2T}(B_z)$ decreases with $B_z$ with a Lorentzian line shape given by $\Delta V_{2T}(B_z) = \Delta V_{2T}(0)/[1+(\omega_L t_s)^2]$. In this way, fits to the Hanle curves allow us to extract the spin lifetime (for the 2T and 4T case) and the spin diffusion constant (for the 4T case).

Figure 3A:
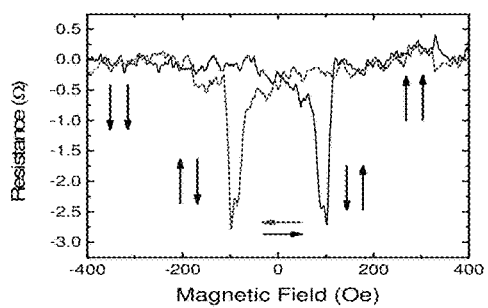
FIGS. 3A, 3B, 3C, and 3D illustrate spin transport data.
Figure 3B:
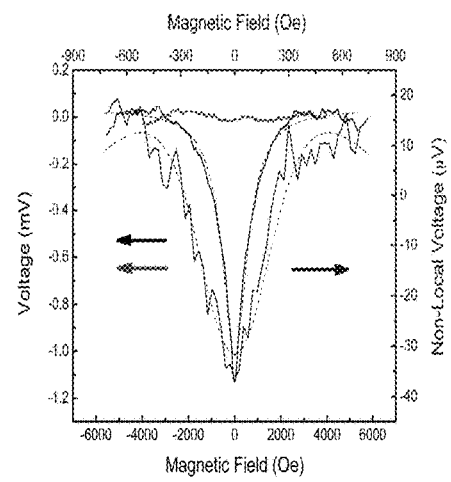
Figure 3C:
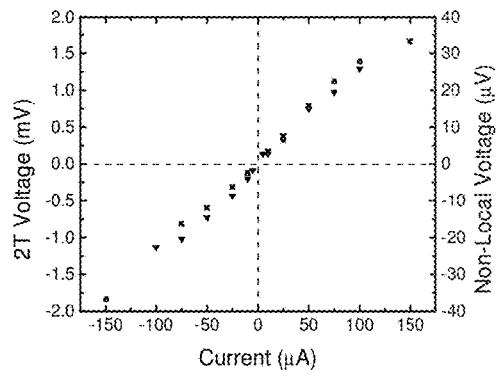
Figure 3D:
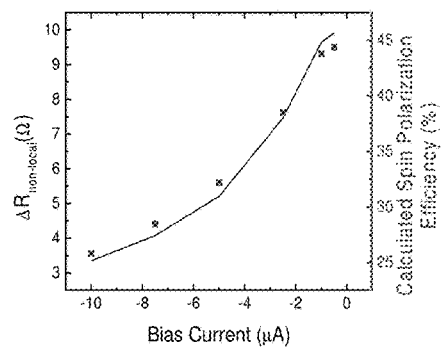

In FIG. 3B we see a strong Hanle signal from the 4T non-local measurement and the 2T measurement. The Hanle signal persists up to ~200 K. Average 4T spin lifetimes were ~200 ps and average 2T spin lifetimes were ~100 ps. The spin diffusion length is given by $L_{SD}=(Dt_s)^{1/2}$ where D is the diffusion constant. We find an average $L_{SD}$~1.5 μm, based on $t_s$~200 ps and D~0.01224 $m^2/s$. The observation of both the non-local Hanle effect and the NLSV provides strong evidence that the fluorinated graphene tunnel barrier indeed enables efficient spin injection, transport, and detection in the graphene channel. Based on the magnitude of the NLSV signal (FIG. 3A) and the calculated spin diffusion length from the 4T Hanle measurements, we can determine the tunneling spin polarization, P, of the Py/fluorinated graphene contact using the formula:

$$\Delta R_{NL} = \frac{P^2 L_{SD}}{W\sigma} \exp\left(\frac{-L}{L_{SD}}\right) \quad (2)$$

where σ is the measured conductivity of $1.29\times10^{-4} \Omega^{-1}$ for the device shown in FIG. 3A, L is the center to center contact spacing of 5.75 μm, $L_{SD}$ is the spin diffusion length of 1.5 μm, W is the width of the graphene channel of 5 μm, and $\Delta R_{NL}\sim3.3\Omega$ is the magnitude of the NLSV plateau for a bias current of −10 μA. From this, we find P-26%. FIG. 3D summarizes the bias dependence $\Delta R_{NL}$ and P. Both increase monotonically with decreasing bias, typical of graphene NLSV devices. We measure values of P up to ~45% at low bias, which is at the upper limit of what can be expected for an intrinsic spin polarization of $Ni_{80}Fe_{20}$, which is 32%-48%. This value is also larger than the highest values measured to date (P=26-30%) in graphene NLSV devices with alumina or MgO tunnel barriers. This indicates that spin-filtering occurs at the Py/fluorinated graphene interface, consistent with theoretical predictions for spin transport across Ni/graphene lattice-matched interfaces, and provides further evidence for the efficacy of the fluorinated graphene tunnel barrier.

Figure 4:
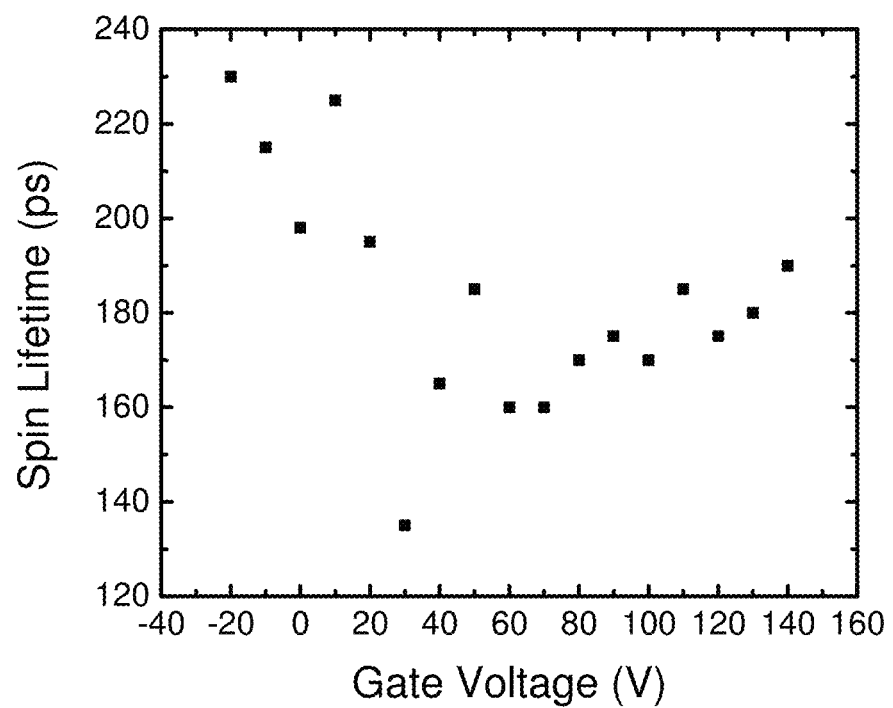
FIG. 4 illustrates gate voltage dependence of the 4T spin lifetime at 10 K. The bias current was −10 µA.

As a final demonstration of the effectiveness of our homoepitaxial structure, we show gate modulation of the spin lifetime in FIG. 4. While most early graphene spin experiments showed spin lifetimes that are constant in gate voltage, other work shows that spin lifetimes are affected by changes in carrier density. Studies that observe gate voltage dependence have in common high contact resistance in the oxide tunnel barrier contacts, indicative of pinhole-free tunnel barriers that prevent back diffusion into the FM contact and subsequent fast spin relaxation. The discrepancy between these measurements is thus likely related to differences in the quality of the tunnel barrier contacts. In all of these cases, it would be difficult to measure the intrinsic properties of the graphene itself. The single-atom thick fluorinated graphene tunnel barrier offers an elegant solution. Our experiments show a clear gate voltage dependent spin signal that follows the Dirac curve, just as predicted by theory.

Our structure demonstrates the first homoepitaxial tunnel barrier/transport system in which the tunnel barrier and transport channel are comprised of the same material, graphene. In previous art, the tunnel barrier and transport channel are very different materials, and such devices require mating dissimilar materials, raising issues of heteroepitaxy, layer uniformity, interface stability and electronic defect states that severely complicate fabrication and compromise performance.

Our new approach obviates these issues. Our approach does not rely upon a second material "wetting" the graphene surface to obtain a uniform and complete tunnel barrier. Graphene, by definition, is uniform in thickness down to a single atom, has very few defects, does not easily form vacancies, and does not intermix readily with other materials—these are key characteristics for a tunnel barrier, in which the tunnel current depends exponentially on the barrier thickness.

Our approach provides a simple and effective way to form a tunnel barrier on graphene. The functionalized graphene tunnel barrier does not affect the adjacent transport channel because it is comprised of the same material, contrary to evaporated dielectric or oxidized metal tunnel barriers, which can structurally damage the graphene or add impurity dopants. This is readily indicated by our high spin polarization values, spin relaxation lengths on par with the highest quality graphene devices, and our ability to control the spin relaxation time with the application of an electrostatic back gate.

Our complete tunnel barrier/transport channel structure also provides for the thinnest of this type of structure ever made, allowing it to be used in applications where space is a premium. Furthermore, due to the thinness of the tunnel barrier, and the advantage that it allows for true electron tunneling, our structure has lower impedance and less loss than other previously made designs, allowing its use in ultra low-power electronics architectures.

A majority of previous tunnel barrier devices using graphene as the conductive transport channel rely on deposited oxides or post deposition oxidized metals, usually both consisting of $Al_2O_3$ or MgO. The deposition is performed with three types of methods: 1) evaporative methods with either thermal or electron beam evaporation to deposit an oxide. The evaporated oxide or metal tends to ball up on the surface, causing cracks and pinholes that limit tunneling. 2) Sputter evaporation of oxide or metal. It has been shown that the graphene transport channel can be irreversibly damaged. 3) Atomic layer deposition of oxides. Successful deposition usually requires a chemical pretreatment of the graphene film, which adds dopants that affect the transport properties. Moreover, oxide tunnel barriers are known to be very difficult to form on graphene since they exhibit de-wetting in the absence of prior chemical treatment of the graphene, and attempts to mitigate this to create a good surface for oxide growth may induce scatterers and defects.

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What is claimed is:
1. A method of making a homoepitaxial tunnel barrier transport device with functionalized graphene-on-graphene, comprising:
   growing a first monolayer graphene film;
   transferring the first monolayer graphene film onto a $SiO_2$/Si substrate;
   spin-coating a layer of PMMA onto the first monolayer graphene film;
   applying a layer of photoresist onto the layer of PMMA;
   defining a mesa pattern using photolithography in the layer of photoresist;
   etching through the layer of PMMA and portions of the first monolayer graphene film with an oxygen plasma;
   defining ohmic reference contacts and bond pads using a MMA/PMMA mask;
   defining features using high-current electron-beam lithography;
   depositing Ti/Au using electron-beam deposition thereby forming a partial device;
   growing a second monolayer graphene film;
   transferring the second monolayer graphene film onto the top of the partial device;
   spin-coating a second layer of PMMA onto the second monolayer graphene film;

spin-coating a second layer of photoresist onto the second layer of PMMA;
defining a second mesa pattern using photolithography in the second layer of photoresist;
etching through the second layer of PMMA and portions of the second monolayer graphene film with an oxygen plasma;
defining trenches for deposition of ferromagnetic contacts by electron beam deposition and lift-off;
fluorinating the second monolayer graphene film;
depositing NiFe/Au by electron beam evaporation thereby forming a device; and
performing a second fluorination to fluorinate the device thereby forming the homoepitaxial tunnel barrier transport device with functionalized graphene-on-graphene.

2. The method of making a homoepitaxial tunnel barrier transport device with functionalized graphene-on-graphene of claim 1, wherein the step of fluorinating the second monolayer graphene film further comprises the step of placing the partial device in $XeF_2$ gas until the resistance of a concurrently fluorinated 2-terminal graphene device reaches about 50 GΩ.

3. The method of making a homoepitaxial tunnel barrier transport device with functionalized graphene-on-graphene of claim 2, wherein the step of performing a second fluorination to fluorinate the device further comprises the step of preventing any edge state conduction.

4. The method of making a homoepitaxial tunnel barrier transport device with functionalized graphene-on-graphene of claim 1, further comprising the step of utilizing the tunneling behavior.

5. The method of making a homoepitaxial tunnel barrier transport device with functionalized graphene-on-graphene of claim 2, further comprising the step of operating the homoepitaxial tunnel barrier transport device with functionalized graphene-on-graphene as a spin valve.

6. A method of making a homoepitaxial tunnel barrier transport device with functionalized graphene-on-graphene, comprising:
growing a first monolayer graphene film;
transferring the first monolayer graphene film onto a $SiO_2$/Si substrate;
preparing a partial device;
growing a second monolayer graphene film;
transferring the second monolayer graphene film onto the top of the partial device;
preparing a second partial device;
fluorinating the second monolayer graphene film; and
forming the homoepitaxial tunnel barrier transport device with functionalized graphene-on-graphene.

7. The method of making a homoepitaxial tunnel barrier transport device with functionalized graphene-on-graphene of claim 6, further comprising:
performing a second fluorination to fluorinate the homoepitaxial tunnel barrier transport device with functionalized graphene-on-graphene.

8. The method of making a homoepitaxial tunnel barrier transport device with functionalized graphene-on-graphene of claim 7, further comprising the step of utilizing the tunneling behavior.

9. The method of making a homoepitaxial tunnel barrier transport device with functionalized graphene-on-graphene of claim 7, further comprising the step of operating the homoepitaxial tunnel barrier transport device with functionalized graphene-on-graphene as a spin valve.

10. The method of making a homoepitaxial tunnel barrier transport device with functionalized graphene-on-graphene of claim 7 further comprising the step of preventing any edge state conduction.

11. A homoepitaxial tunnel barrier transport device with functionalized graphene-on-graphene, comprising:
a substrate;
a monolayer graphene film; and
a chemically modified monolayer graphene film.

12. The homoepitaxial tunnel barrier transport device with functionalized graphene-on-graphene of claim 11, wherein the chemically modified monolayer graphene film is a fluorinated monolayer graphene film.

13. The homoepitaxial tunnel barrier transport device with functionalized graphene-on-graphene of claim 11, wherein the chemically modified monolayer graphene film is a hydrogenated monolayer graphene film.

14. The homoepitaxial tunnel barrier transport device with functionalized graphene-on-graphene of claim 12, wherein the fluorinated monolayer graphene film is a tunnel barrier.

15. The homoepitaxial tunnel barrier transport device with functionalized graphene-on-graphene of claim 11, wherein there is no electrical connection between the monolayer graphene film and the chemically modified monolayer graphene film.

16. The homoepitaxial tunnel barrier transport device with functionalized graphene-on-graphene of claim 11, wherein the tunneling spin efficiency is from about 26% to about 46%.

* * * * *